United States Patent
Liu

(10) Patent No.: US 9,716,116 B1
(45) Date of Patent: Jul. 25, 2017

(54) TFT ARRAY SUBSTRATE

(71) Applicant: Wuhan China Star Optoelectronics Technology Co., Ltd., Wuhan (CN)

(72) Inventor: Yuanfu Liu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/137,003

(22) Filed: Apr. 25, 2016

(30) Foreign Application Priority Data

Jan. 19, 2016 (CN) .......................... 2016 1 0035497

(51) Int. Cl.
| | |
|---|---|
| *H01L 27/12* | (2006.01) |
| *H01L 29/786* | (2006.01) |
| *H01L 29/45* | (2006.01) |
| *H01L 29/49* | (2006.01) |

(52) U.S. Cl.
CPC ........ *H01L 27/1255* (2013.01); *H01L 27/124* (2013.01); *H01L 27/1222* (2013.01); *H01L 27/1248* (2013.01); *H01L 29/456* (2013.01); *H01L 29/495* (2013.01); *H01L 29/4908* (2013.01); *H01L 29/78633* (2013.01); *H01L 29/78675* (2013.01)

(58) Field of Classification Search
CPC ...................................................... H01L 28/87
See application file for complete search history.

(56) References Cited

U.S. PATENT DOCUMENTS

| | | | |
|---|---|---|---|
| 2009/0053430 A1* | 2/2009 | Matsumori | ....... G02F 1/133723 428/1.25 |
| 2011/0297941 A1* | 12/2011 | Zhan | ....................... H01L 28/87 257/59 |

* cited by examiner

*Primary Examiner* — Fernando L Toledo
*Assistant Examiner* — Valerie N Newton
(74) *Attorney, Agent, or Firm* — Leong C. Lei

(57) ABSTRACT

Provided is a TFT array substrate, which increases the area of a drain electrode of a TFT within a light-shielding zone to have the drain electrode overlapping a portion of a horizontal projection of a common electrode, wherein the drain electrode and the common electrode constitute a first storage capacitor and a pixel electrode and the common electrode constitute a second storage capacitor. The pixel electrode and the drain electrode are electrically connected and thus are of the same potential. The first storage capacitor and the second storage capacitor are connected in parallel and collectively form a storage capacitor such that the storage capacitor has a capacity that is equal to the sum of capacities of the first storage capacitor and the second storage capacitor, whereby, without reducing aperture ratio, the capacity of the storage capacitor is increased, crosstalk and image sticking are alleviated, and product display quality is enhanced.

9 Claims, 5 Drawing Sheets ized to form a storage capacitor by means of an overlapping portion between the common electrode and the pixel electrode. Referring to FIGS. 1-3, a conventional TFT array substrate generally comprises: a backing plate 10, a buffer layer 20 formed on the backing plate 10, a plurality of TFTs 90 formed on the buffer layer 20 and arranged in an array, a planarization layer 50 covering on the TFTs 90, a common electrode 60 formed on the planarization layer 50, a protection layer 70 covering the common electrode 60, and a patterned pixel electrode 80 formed on the protection layer 70. The pixel electrode 80 overlaps a portion of the common electrode 60 to form a storage capacitor Cst. The pixel electrode 80 is in connection with a drain electrode 901 of the TFT 90. The drain electrode 901 of the TFT 90 is in connection with a poly-silicon semiconductor layer 902. In the conventional TFT array substrate, the drain electrode 901 of the TFT 90 has a small area and is provided only for electrical connection with the pixel electrode 80 and the poly-silicon semiconductor layer 902. The drain electrode 901 does not overlap the common electrode 60.

With the continuous progress of the display technology, the definition and resolution of high quality display panels are getting increasingly high so that the aperture ratio of the display panels are correspondingly reduced and the storage capacitance is getting increasingly reduced. The charging time for each of the pixels is gradually shortened. The amount of charges retained in the storage capacitor is no longer capable of maintaining a normal operation voltage for the pixel and eventually, drawbacks, such as crosstalk and image sticking, result. Thus, it is an issue to be immediately addressed to expand the capacity of the storage capacitor of a high quality display panel. The conventional TFT array substrate shown in FIGS. 1 and 2 is generally hard to change the area of the patterned pixel electrode 80 due to limitations imposed by technical capability and desires for optic taste and transmission rate. In other words, it is not possible to expand the capacity of the storage capacitor by means of increasing the area of the pixel electrode 80.

TFT ARRAY SUBSTRATE

BACKGROUND OF THE INVENTION

1. Field of the Invention

The present invention relates to the field of display technology, and in particular to a thin-film transistor (TFT) array substrate.

2. The Related Arts

Liquid crystal displays (LCDs) have a variety of advantages, such as thin device body, low power consumption, and being free of radiation, and thus have wide applications, such as liquid crystal televisions, mobile phones, personal digital assistants (PDAs), digital cameras, computer monitors, and notebook computer screens, making them take a leading position in the field of flat panel displays.

Most of the LCDs that are currently available in the market are backlighting LCDs, which comprise a liquid crystal display panel and a backlight module. The working principle of the liquid crystal display panel is that liquid crystal molecules are filled between a thin-film transistor (TFT) array substrate and a color filter (CF) substrate and a drive voltage is applied to the two substrates to control a rotation direction of the liquid crystal molecules in order to refract out light emitting from the backlight module to generate an image.

The TFT array substrate comprises a plurality of gate lines and data lines. The plurality of gate lines and the plurality of data lines are perpendicular to each other to define a plurality of pixel units. Each of the pixel units comprises therein a TFT, a pixel electrode, and a storage capacitor. The TFT has a gate electrode that is connected to the gate lines, a source electrode that is connected to the data lines, and a drain electrode that is connected to the pixel electrode. When the gate lines are driven, the TFT is set in a conducting state so that a grayscale voltage signal that is fed through the corresponding data line is loaded into the pixel electrode, whereby a corresponding electric field is generated between the pixel electrode and a common electrode. The liquid crystal molecules contained in the liquid crystal layer is acted upon by the electric field to change direction thereby achieving displaying of various images.

The storage capacitor provides an important function of maintaining a voltage level. An existing TFT array substrate is structured to form a storage capacitor by means of an overlapping portion between the common electrode and the pixel electrode. Referring to FIGS. 1-3, a conventional TFT

SUMMARY OF THE INVENTION

An object of the present invention is to provide a thin-film transistor (TFT) array substrate, which increases the capacity of a storage capacitor, alleviates the issues of crosstalk and image sticking, and enhance product display quality, but does not reduce the aperture ratio.

To achieve the above objects, the present invention provides a TFT array substrate, which comprises a backing plate, a buffer layer formed on the backing plate, a plurality of TFTs formed on the buffer layer and arranged in an array, a planarization layer formed on the TFTs, a common electrode formed on the planarization layer, a protection layer formed on the common electrode, and a patterned pixel electrode formed on the protection layer;

the TFTs each comprising a poly-silicon semiconductor layer formed on the buffer layer, a gate insulation layer set on and covering the poly-silicon semiconductor layer, a gate electrode formed on the gate insulation layer and located above the poly-silicon semiconductor layer, an interlayer insulation layer set on and covering the gate electrode and the gate insulation layer, and a source electrode and a drain electrode formed on the interlayer insulation layer;

the pixel electrode being electrically connected to the drain electrode;

the drain electrode overlapping a portion of a horizontal projection of the common electrode;

the drain electrode and the common electrode constituting a first storage capacitor, the pixel electrode and the common electrode constituting a second storage capacitor, the first storage capacitor and the second storage capacitor being connected in parallel to form a storage capacitor.

A portion of the planarization layer is located in an area of overlapping between the drain electrode and the portion of the horizontal projection of the common electrode and has a thickness that is less than a thickness of a portion of the planarization layer located outside the area of overlapping between the drain electrode and the portion of the horizontal projection of the common electrode.

The thickness of the portion of the planarization layer that is located in the area of overlapping between the drain electrode and the portion of the horizontal projection of the common electrode is 0.5 μm-1 μm and the thickness of the portion of the planarization layer that is located outside the area of overlapping between the drain electrode and the portion of the horizontal projection of the common electrode is 1.5 μm-3 μm.

The pixel electrode is set in engagement with the drain electrode through a via formed through the protection layer, the common electrode, and the planarization layer.

The TFT array substrate further comprises a plurality of gate scan lines arranged in a first direction to be parallel to and spaced from each other and a plurality of data lines arranged in a second direction that is perpendicular to the first direction to be parallel to and spaced from each other; the data lines, the source electrode, and the drain electrode being located on a common layer, the data lines and the source electrode being electrically connected; the gate scan lines and the gate electrode being located on a common layer and electrically connected.

The source electrode and the drain electrode are respectively set in engagement with two ends of the poly-silicon semiconductor layer through vias extending through the interlayer insulation layer and the gate insulation layer for electrical connection therebetween.

The pixel electrode and the common electrode are formed of a material comprising indium tin oxide (ITO).

The buffer layer, the gate insulation layer, the interlayer insulation layer, the planarization layer, and the protection layer are formed of a material comprising one of silicon nitride and silicon oxide or a combination of the two.

The gate scan lines, the data lines, the gate electrode, the source electrode, and the drain electrode are formed of a material comprising one of molybdenum, titanium, copper, and aluminum or a stacked combination of multiple ones thereof.

The efficacy of the present invention is that the present invention provides a TFT array substrate that increases the area of a drain electrode of a TFT within a light-shielding zone to have the drain electrode overlapping a portion of a horizontal projection of a common electrode, wherein the drain electrode and the common electrode constitute a first storage capacitor and a pixel electrode and the common electrode constitute a second storage capacitor. The pixel electrode and the drain electrode are electrically connected and thus are of the same potential. The first storage capacitor and the second storage capacitor are connected in parallel and collectively form a storage capacitor such that the storage capacitor has a capacity that is equal to the sum of capacities of the first storage capacitor and the second storage capacitor, whereby compared to the prior art, the capacity of the storage capacitor is increased, the issues of crosstalk and image sticking are alleviated, and product display quality is enhanced, but the aperture ratio is not reduced.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
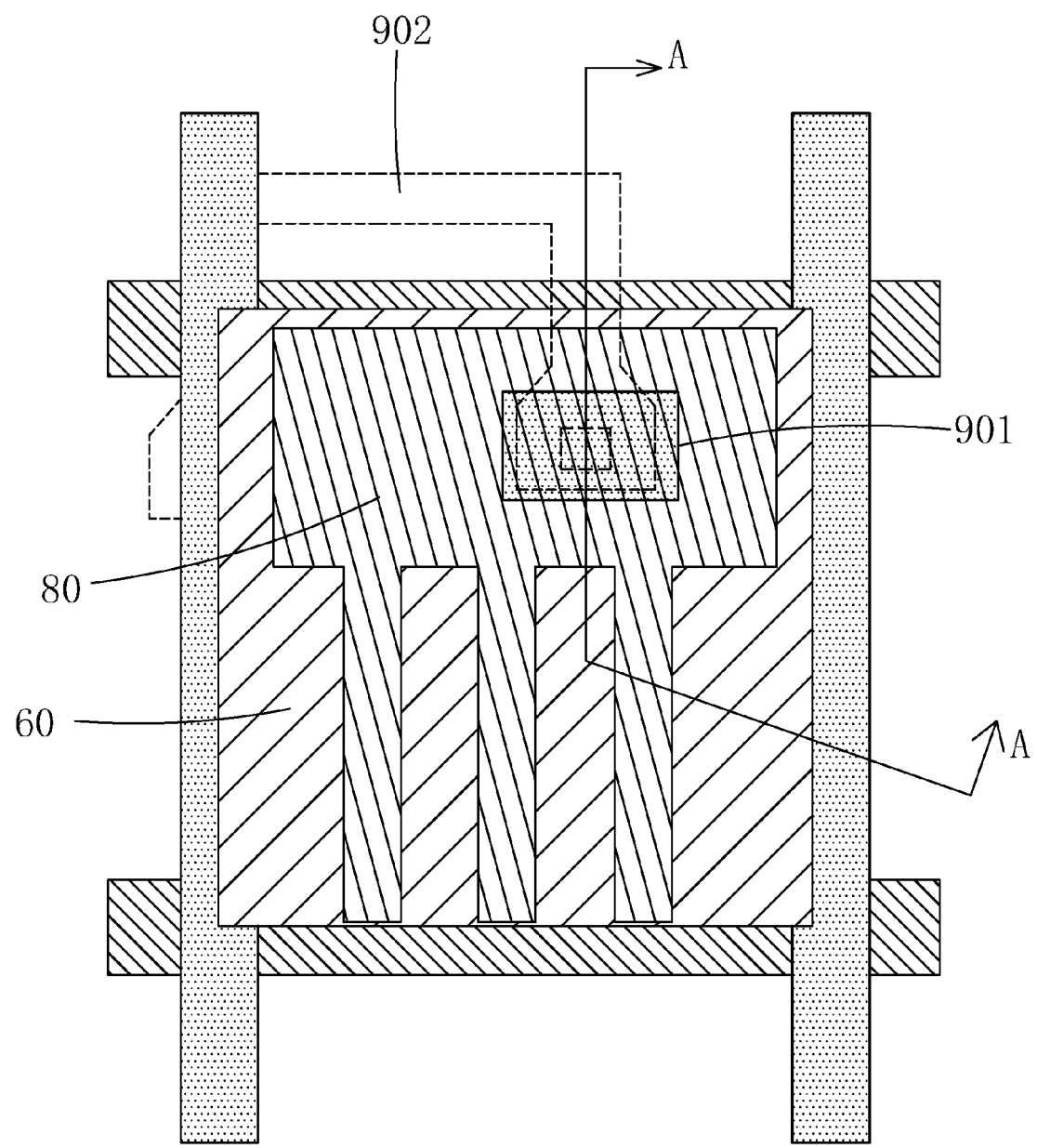
FIG. 1 is a top plan view illustrating a conventional thin-film transistor (TFT) array substrate.
Figure 2:
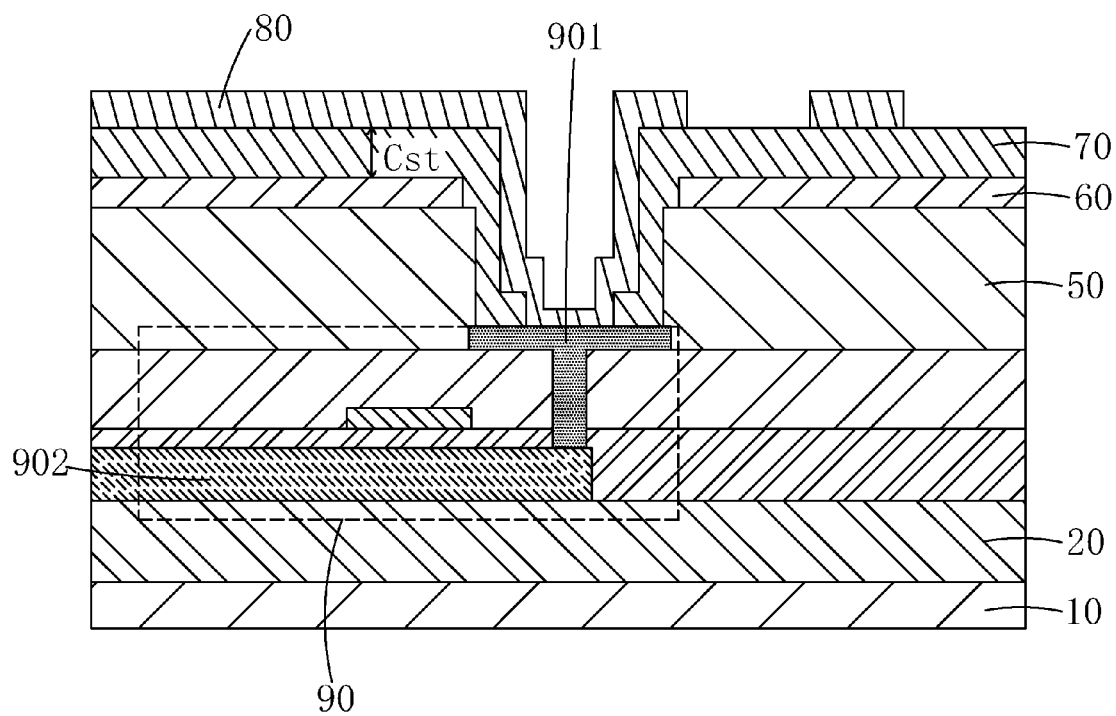
FIG. 2 is a cross-sectional view taken along line A-A of the TFT array substrate illustrated in FIG. 1.
Figure 3:
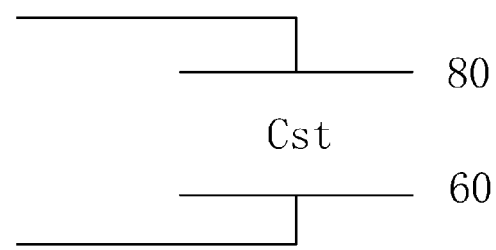
FIG. 3 is a schematic view illustrating an equivalent circuit of a storage capacitor of the TFT array substrate shown in FIG. 1.
Figure 4:
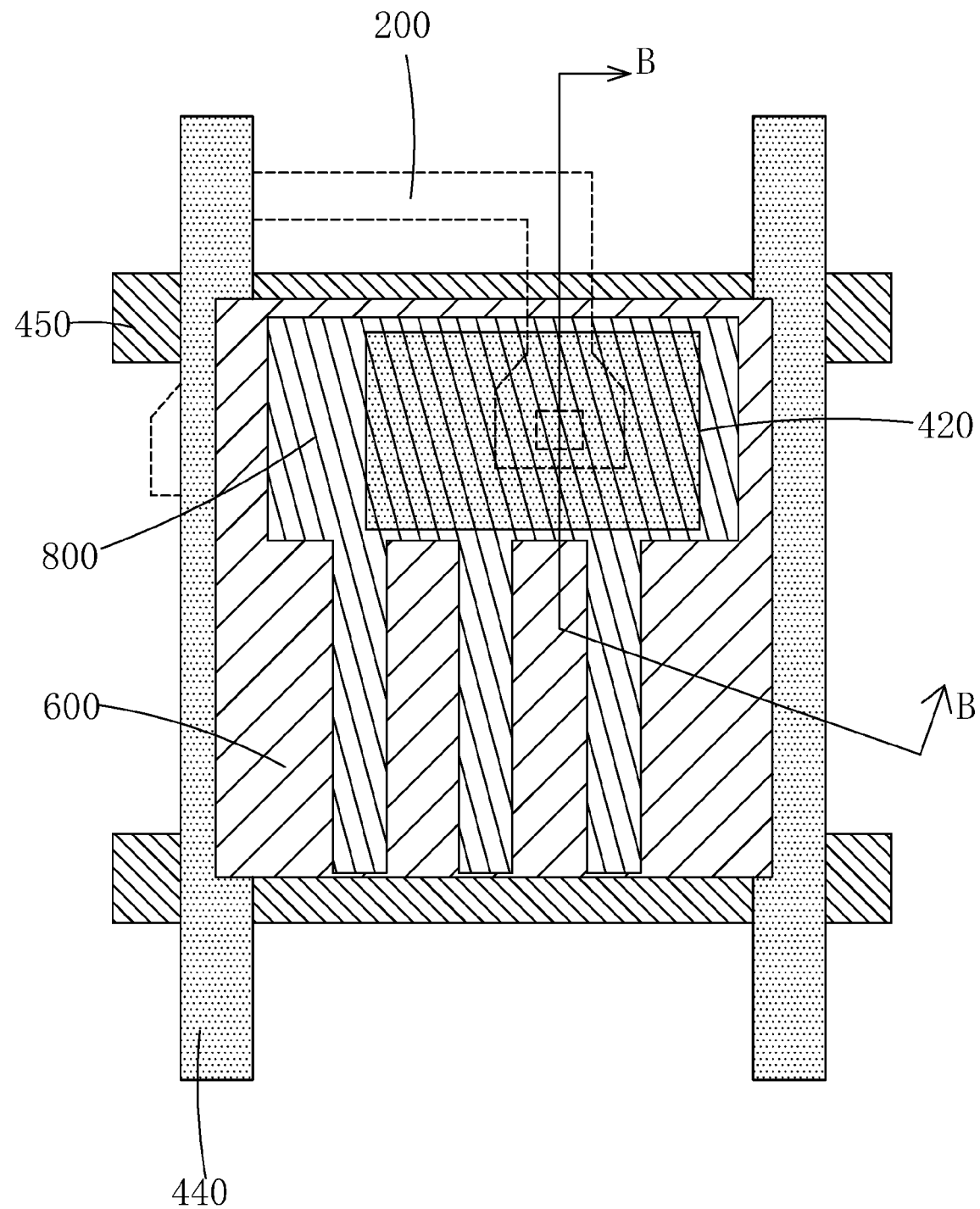
FIG. 4 is a top plan view illustrating a TFT array substrate according to the present invention.
Figure 5:
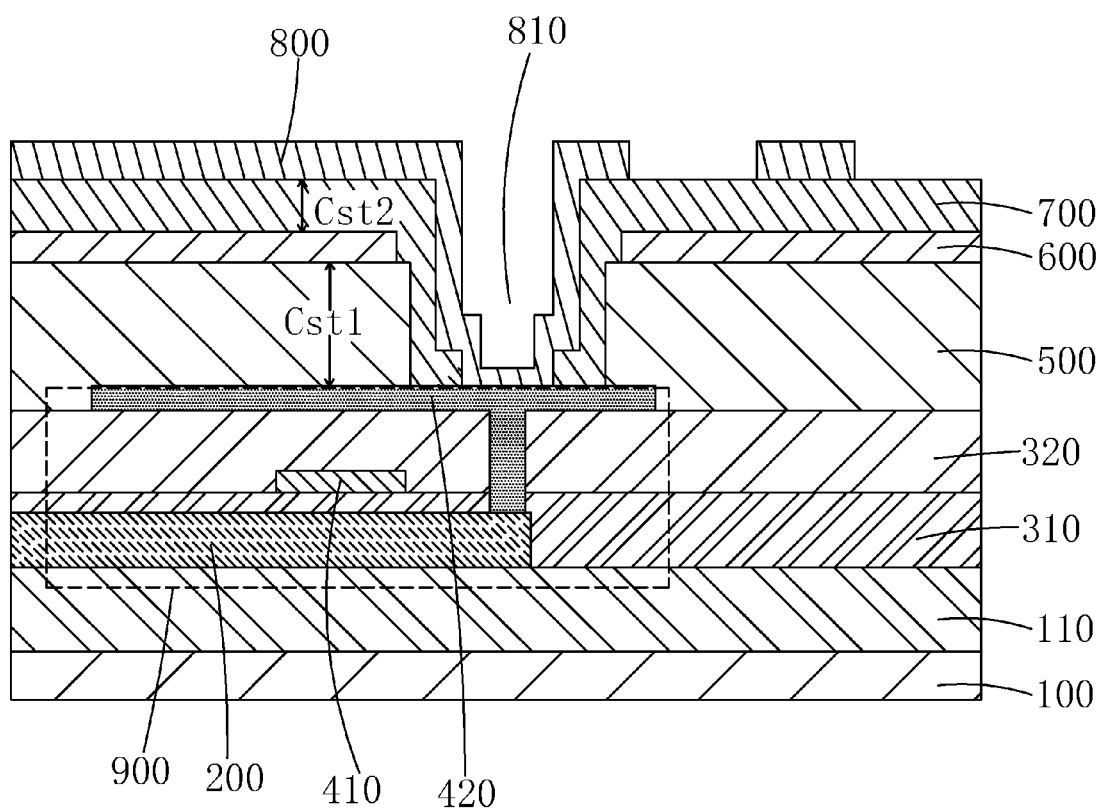
FIG. 5 is a cross-sectional view taken along line B-B of the TFT array substrate shown in FIG. 4 according to a first embodiment.
Figure 6:
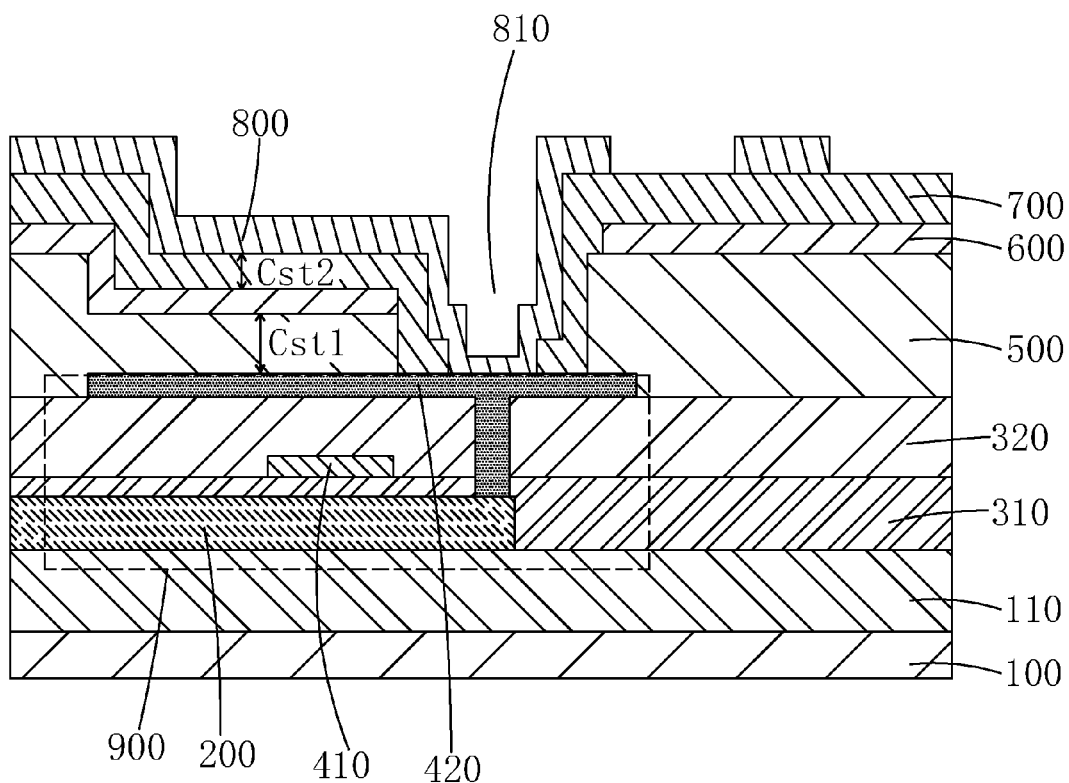
FIG. 6 is a cross-sectional view taken along line B-B of the TFT array substrate shown in FIG. 4 according to a second embodiment.

Referring to FIG. 4, in combination with FIG. 5 or 6, the present invention provides a thin-film transistor (TFT) array substrate, which comprises: a backing plate 100, a buffer layer 110 formed on the backing plate 100, a plurality of TFTs 900 formed on the buffer layer 110 and arranged in an array, a planarization layer 500 formed on the TFTs 900, a common electrode 600 formed on the planarization layer 500, a protection layer 700 formed on the common electrode 600, and a patterned pixel electrode 800 formed on the protection layer 700.

The TFTs 900 each comprises: a poly-silicon semiconductor layer 200 formed on the buffer layer 110, a gate insulation layer 310 set on and covering the poly-silicon semiconductor layer 200, a gate electrode 410 formed on the gate insulation layer 310 and located above the poly-silicon semiconductor layer 200, an interlayer insulation layer 320 set on and covering the gate electrode 410 and the gate insulation layer 310, and a source electrode (not shown) and a drain electrode 420 formed on the interlayer insulation layer 320.

The pixel electrode 800 is electrically connected to the drain electrode 420. Compared to a drain electrode of the prior art, the drain electrode 420 has an expanded area located within a light-shielding zone so as to overlap a portion of a horizontal projection of the common electrode 600.

Figure 7:
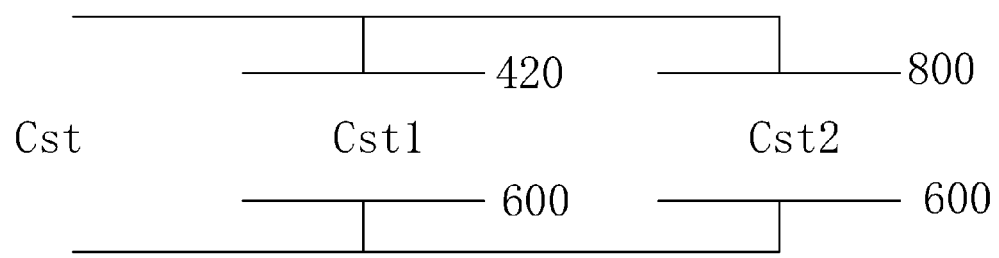
FIG. 7 is a schematic view illustrating an equivalent circuit of a storage capacitor of the TFT array substrate according to the present invention.

As shown in FIGS. 5 and 7, or FIGS. 6 and 7, the drain electrode 420 and the common electrode 600 constitute a first storage capacitor Cst1 and the pixel electrode 800 and the common electrode 600 constitute a second capacitor Cst2. Since the pixel electrode 800 and the drain electrode 420 are electrically connected, they have the same potential and the first storage capacitor Cst1 and the second storage capacitor Cst2 are connected in parallel to each other to form collectively a storage capacitor Cst.

Specifically, referring to FIGS. 4 and 5, in a first embodiment of the TFT array substrate according to the present invention, the planarization layer 500 has a substantially uniform thickness for the entirety thereof and preferably, the thickness of the planarization layer 500 is 1.5 μm-3 μm.

The TFT array substrate of the first embodiment increases the area of the drain electrode 420 of the TFT 900 in order to have the drain electrode 420 overlapping a portion of the horizontal projection of the common electrode 600, wherein the drain electrode 420 and the common electrode 600 constitute the first storage capacitor Cst1 and the pixel electrode 800 and the common electrode 600 constitute the second storage capacitor Cst2. The first storage capacitor Cst1 and the second storage capacitor Cst2 are connected in parallel to collectively form the storage capacitor Cst. The capacity of the storage capacitor Cst is equal to the sum of the capacities of the first storage capacitor Cst1 and the second storage capacitor Cst2. Compared to the prior art, the first storage capacitor Cst1 constituted by the drain electrode 420 and the common electrode 600 is additionally included. Further, a black matrix for shielding light is provided above TFT 900 such that the drain electrode 420 is located in the light-shielding zone, whereby the increase of the area of the drain electrode 420 does not cause reduction of aperture ratio. Thus, the capacity of the storage capacitor is increased, the issues of crosstalk and image sticking are alleviated, and product display quality is enhanced, but the aperture ratio is not reduced.

Referring to FIGS. 4 and 6, to further increase the storage capacitor, in a second embodiment of the TFT array substrate according to the present invention, a portion of the planarization layer 500 that is located in the area of overlapping between the drain electrode 420 and the portion of the horizontal projection of the common electrode 600 is made having a thickness less than a thickness of a portion of the planarization layer 500 that is located outside the area of overlapping between the drain electrode 420 and the portion of the horizontal projection of the common electrode 600. Specifically, the different thicknesses of the planarization layer 500 can be achieved by means of an exposure process with a half-tone mask. Compared to the first embodiment, the second embodiment reduces the distance between an electrode plate (the common electrode 600) and an opposite electrode plate (the drain electrode 420) of the first capacitor Cst1 so as to further increase the capacity of the first capacitor Cst1. Preferably, the portion of the planarization layer 500 that is located in the area of overlapping between the drain electrode 420 and the portion of the horizontal projection of the common electrode 600 has a thickness of 0.5 μm-1 μm, while the portion of the planarization layer 500 that is located outside the area of overlapping between the drain electrode 420 and the portion of the horizontal projection of the common electrode 600 has a thickness of 1.5 μm-3 μm.

Specifically, the pixel electrode 800 is set in engagement with the drain electrode 420 through a via 810 formed through the protection layer 700, the common electrode 600, and the planarization layer 500 to establish electrical connection therebetween.

The array substrate further comprises: a plurality of gate scan lines 450 arranged in a first direction to be parallel to and spaced from each other and a plurality of data lines 440 arranged in a second direction that is perpendicular to the first direction to be parallel to and spaced from each other. Further, the data lines 440, the source electrode, and the drain electrode 420 are located on the same layer and the data lines 440 and the source electrode are electrically connected such that they can be formed by patterning a second metal layer. The gate scan lines 450 and the gate electrode 410 are located on the same layer and can be formed by patterning a first metal layer.

The source electrode and the drain electrode 420 are respectively set in engagement with two ends of the poly-silicon semiconductor layer 200 through vias extending through the interlayer insulation layer 320 and the gate insulation layer 310 to establish electrical connection therebetween.

Preferably, the pixel electrode 80 and the common electrode 60 are formed of a material comprising indium tin oxide (ITO). The buffer layer 110, the gate insulation layer 310, the interlayer insulation layer 320, the planarization layer 500, and the protection layer 700 are formed of a material comprising one of silicon nitride (SiNx) and silicon oxide (SiOx) or a combination of the two. The gate scan lines 450, the data lines 440, the gate electrode 410, the source electrode, and the drain electrode 420 are formed of a material comprising one of molybdenum (Mo), titanium (Ti), copper (Cu), and aluminum (Al) or a stacked combination of multiple ones thereof.

In summary, the present invention provides a TFT array substrate that increases the area of a drain electrode of a TFT within a light-shielding zone to have the drain electrode overlapping a portion of a horizontal projection of a common electrode, wherein the drain electrode and the common electrode constitute a first storage capacitor and a pixel electrode and the common electrode constitute a second storage capacitor. The pixel electrode and the drain electrode are electrically connected and thus are of the same potential. The first storage capacitor and the second storage capacitor are connected in parallel and collectively form a storage capacitor such that the storage capacitor has a capacity that is equal to the sum of capacities of the first storage capacitor and the second storage capacitor, whereby compared to the prior art, the capacity of the storage capacitor is increased, the issues of crosstalk and image sticking are alleviated, and product display quality is enhanced, but the aperture ratio is not reduced.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) array substrate, comprising a backing plate, a buffer layer formed on the backing plate, a plurality of TFTs formed on the buffer layer and arranged in an array, a planarization layer formed on the TFTs, a common electrode formed on the planarization layer, a protection layer formed on the common electrode, and a patterned pixel electrode formed on the protection layer;

the TFTs each comprising a poly-silicon semiconductor layer formed on the buffer layer, a gate insulation layer set on and covering the poly-silicon semiconductor layer, a gate electrode formed on the gate insulation layer and located above the poly-silicon semiconductor layer, an interlayer insulation layer set on and covering the gate electrode and the gate insulation layer, and a source electrode and a drain electrode formed on the interlayer insulation layer;

the pixel electrode being electrically connected to the drain electrode;

the drain electrode overlapping a portion of a horizontal projection of the common electrode;

the drain electrode and the common electrode constituting a first storage capacitor, the pixel electrode and the common electrode constituting a second storage capacitor, the first storage capacitor and the second storage capacitor being connected in parallel to form a storage capacitor;

wherein the drain electrode, the common electrode, and the pixel electrode are arranged such that the drain electrode and the pixel electrode are respectively on two opposite sides of common electrode, where the drain electrode faces a first one of the two opposite sides of the common electrode to collectively form the first storage capacitor and the pixel electrode faces a second one of the two opposite sides of the common electrode to collectively form the second storage capacitor.

2. The TFT array substrate as claimed in claim 1, wherein a portion of the planarization layer is located in an area of overlapping between the drain electrode and the portion of the horizontal projection of the common electrode and has a thickness that is less than a thickness of a portion of the planarization layer located outside the area of overlapping between the drain electrode and the portion of the horizontal projection of the common electrode.

3. The TFT array substrate as claimed in claim 2, wherein the thickness of the portion of the planarization layer that is located in the area of overlapping between the drain electrode and the portion of the horizontal projection of the common electrode is 0.5μm-1μm and the thickness of the portion of the planarization layer that is located outside the area of overlapping between the drain electrode and the portion of the horizontal projection of the common electrode is 1.5μm-3μm.

4. The TFT array substrate as claimed in claim 1, wherein the pixel electrode is set in engagement with the drain electrode through a via formed through the protection layer, the common electrode, and the planarization layer.

5. The TFT array substrate as claimed in claim 1 further comprising a plurality of gate scan lines arranged in a first direction to be parallel to and spaced from each other and a plurality of data lines arranged in a second direction that is perpendicular to the first direction to be parallel to and spaced from each other; the data lines, the source electrode, and the drain electrode being located on a common layer, the data lines and the source electrode being electrically connected; the gate scan lines and the gate electrode being located on a common layer and electrically connected.

6. The TFT array substrate as claimed in claim 1, wherein the source electrode and the drain electrode are respectively set in engagement with two ends of the poly-silicon semiconductor layer through vias extending through the interlayer insulation layer and the gate insulation layer for electrical connection therebetween.

7. The TFT array substrate as claimed in claim 1, wherein the pixel electrode and the common electrode are formed of a material comprising indium tin oxide (ITO).

8. The TFT array substrate as claimed in claim 1, wherein the buffer layer, the gate insulation layer, the interlayer insulation layer, the planarization layer, and the protection layer are formed of a material comprising one of silicon nitride and silicon oxide or a combination of the two.

9. The TFT array substrate as claimed in claim 5, wherein the gate scan lines, the data lines, the gate electrode, the source electrode, and the drain electrode are formed of a material comprising one of molybdenum, titanium, copper, and aluminum or a stacked combination of multiple ones thereof.

* * * * *